United States Patent
Thornton

(10) Patent No.: US 6,171,712 B1
(45) Date of Patent: Jan. 9, 2001

(54) PALLADIUM AND PALLADIUM/COPPER THIN FLAT MEMBRANES

(75) Inventor: Peter Howard Thornton, Dearborn, MI (US)

(73) Assignee: Ford Global Technologies, Inc., Dearborn, MI (US)

(*) Notice: Under 35 U.S.C. 154(b), the term of this patent shall be extended for 0 days.

(21) Appl. No.: 09/525,364

(22) Filed: Mar. 15, 2000

(51) Int. Cl.$^7$ .......................... C23C 14/02; C23C 14/14; C23C 14/58

(52) U.S. Cl. .................. 428/606; 204/192.15; 427/245; 95/56

(58) Field of Search .................. 95/56; 428/606; 96/4; 204/192.15; 55/522; 427/245, 247, 336, 339, 299

(56) References Cited

U.S. PATENT DOCUMENTS

| | | |
|---|---|---|
| 3,024,965 | 3/1962 | Milleron. |
| 3,563,873 | 2/1971 | Beyer. |
| 3,801,368 | 4/1974 | Fusayama et al.. |
| 4,352,835 | 10/1982 | Holbrook et al.. |
| 4,857,080 * | 8/1989 | Baker et al. ............................. 55/16 |
| 4,900,581 | 2/1990 | Stuke et al.. |
| 5,017,237 | 5/1991 | Svensson. |
| 5,480,684 | 1/1996 | Sandhu. |
| 5,656,542 | 8/1997 | Miyata et al.. |
| 6,086,729 * | 7/2000 | Bredesen et al. ............... 204/192.15 |

FOREIGN PATENT DOCUMENTS

WO 97/40914 * 11/1997 (WO).

OTHER PUBLICATIONS

"Effects of substrate orientation and rotation on internal stresses in sputtered metal films", D. W. Hoffman & John A. Thornton—J. Vac. Sci. Technol., Mar., 1979.

Internal stresses in amorphous silicon films deposited by cylindrical magnetron sputtering using Ne, Ar, Kr, Xe, and AR+$H_2$, J. A. Thornton & D. W. Hoffman, J. Vac, Sci. Technol., Mar., 1981.

* cited by examiner

Primary Examiner—John J. Zimmerman
(74) Attorney, Agent, or Firm—Lorraine S. Melotik

(57) ABSTRACT

This invention is a method for making a thin, flat metal membrane of palladium or palladium/copper alloy. It involves sputtering the metal onto a flat surface of a substrate under conditions such that a deposited film is essentially free of compressive and tensile stresses. The membrane that results upon removal of the film from the substrate, as by dissolving a parting layer therebetween, does not curl up.

20 Claims, No Drawings

PALLADIUM AND PALLADIUM/COPPER THIN FLAT MEMBRANES

TECHNICAL FIELD

This invention is directed to a process of preparing a thin flat membrane of palladium or palladium/copper alloy useful for gas separation in a fuel cell. More particularly, this membrane is prepared by sputtering a layer of the metal onto a flat surface and subsequently separating off the metal layer. It is necessary that the deposited layer is essentially stress-free.

BACKGROUND OF THE INVENTION

Development of the electric vehicle has recently undergone increased activity in an effort to reduce air pollution and conserve fuel resources. A major stumbling block in the development of electric vehicles has been developing a suitable means of supplying power for the electrical drive motors. In most instances, the power has been supplied from a battery source. However, the current battery technology is not capable of supplying a sufficient amount of energy to power the vehicle over extended distances.

Fuel cells have recently been examined as an alternative power source for electrical vehicles. A fuel cell is a demand-type power system in which the fuel cell operates in response to the load imposed across the fuel cell. Typically, a liquid hydrogen-containing fuel (e.g., gasoline, methanol, diesel, naphtha, etc.) once converted to a gaseous stream that contains hydrogen serves as the fuel supply for the fuel cell. Converting the liquid fuel (like methanol or gasoline) to a gas containing hydrogen takes place when the fuel is passed through a fuel reformer. In a fuel reformer, the liquid fuel reacts with steam. The gas formed includes hydrogen gas (20–75% depending on the liquid fuel) and usually contains other passivating gas species such as carbon monoxide, carbon dioxide, methane, water vapor, oxygen, nitrogen, unburned fuel and, in some cases, hydrogen sulfide. An oxidant, usually air, is supplied to the fuel cell to react with the hydrogen gas produced to produce electric current. The electric current can then be drawn on demand in response to loads across the fuel cell to power electrical devices, such as an electric motor of an electric vehicle.

For the fuel cell to generate electric current, however, the hydrogen gas must first be separated from the other gases formed by the fuel reformer. The hydrogen gas atom is very small and it can diffuse through some metals, whereas the other gases have relatively large molecules and so are blocked from passing through. Palladium membranes (i.e., films) are widely used for hydrogen gas separation in the chemical industry. Since palladium is very expensive, however, the membranes can be made less expensive by using a palladium alloy. Metal films can be made by evaporation from a melt under a high vacuum onto a substrate but these films as a rule have a high internal stress, usually compressive. On separation from the substrate, the films spontaneously roll up. In order to make them useful as gas separation membranes, they must be made flat. This involved unrolling the film, holding it down flat and then annealing it, a process having the potential to damage the films and adding to the manufacturing complexity.

I have now found a method of making hydrogen separation membranes by a particular sputtering process yielding flat, thin films. It thus avoids the complexity of the prior art manufacturing process described above.

DISCLOSURE OF THE INVENTION

The invention is a method of making a flat thin metal membrane of palladium or palladium/copper alloy useful as a diaphragm in fuel reformers for separating the hydrogen from the other gaseous products of the reforming reaction. The method includes the steps of providing a substrate having a flat surface, at least a portion of the flat surface being coated with a parting material capable of being dissolved by a solvent. Then, a layer of metal (palladium or palladium/copper alloy) is sputtered onto the parting material under an inert gas atmosphere. It is critical that the gas atmosphere pressure be such that the sputtered film is essentially free of tensile and compressive stress. To separate the film from the substrate, the method includes then subjecting the parting material to solvent. This dissolves the parting material and releases the flat metal membrane. The substrate may be a material like silicon wafer.

Advantageously, the method provides a flat membrane needing no further processing to make it flat before use as in a fuel cell. This is in contrast to films made by evaporation under a high vacuum, which have high compressive stress, and roll into a tube shape upon removal from the substrate.

DISCUSSION OF PREFERRED EMBODIMENTS

The invention involves manufacturing an essentially flat membrane of palladium or palladium/copper metal. According to the method, a metal film is sputtered onto a flat surface of a substrate coated with a layer of a parting material. The use of the parting material allows easy separation of the thin metal film from the substrate yielding a flat metal membrane. It is critical to the invention that the deposited film be essentially free of internal stresses in order to yield a flat membrane upon removal from the substrate. This and other aspects of the invention are discussed in detail below.

The substrate can be a silicon wafer or any other material that has a flat, smoothly polished surface, for example a glass or metal plate. On at least that portion of the flat surface on which is intended to be deposited the thin metal film, a layer of solvent soluble parting material is present. Parting materials are well known in the industry. Cellulose acetate is one example, and can be applied as a solution of the cellulose acetate in acetone, for example 1 g cellulose acetate in 10/ml of acetone. Other parting materials such as photoresist could also be used. The parting material may be applied in any way. One option involves pouring a small amount of the parting material onto the flat surface of the silicon wafer mounted on a spinner. The spinner is then operated for a few moments to spread the parting material uniformly over the wafer surface, after which the wafer is removed and placed under a heat lamp to evaporate a solvent like acetone from a solution of cellulose acetate parting material.

The substrate, e.g., the silicon wafer, coated with a parting layer, is then mounted in the vacuum chamber of the sputtering equipment system. Sputtering techniques are well known in the art. It is a process by which a substance may be deposited as a thin film on a substrate in a low pressure gas, typically a few mTorr to 100 mTorr, which provides a medium in which a glow discharge can be maintained. General sputtering techniques are discussed, for example, in Thin Film Processes, ed. John L. Vossen and Werner Kern, Academic Press, New York, 1978 which is hereby expressly incorporated by reference for its teachings. In one exemplary sputtering system of the present invention, a dual beam system is used in which the substrate was mounted parallel to, but less than 10 cm from a palladium/copper alloy source. While I have found that forming a membrane of 60/40 Pd/Cu is particularly useful in the present invention for use as a fuel cell membrane, the membrane alloy can include as much as 52% copper or no copper, i.e., be all palladium.

The object of the present method is to form a membrane that remains flat upon separation from the substrate. To be able to form such a membrane, it was unexpectedly found that a particular gas pressure is necessary during sputtering of the film unto the substrate. That is, the pressure in the system during sputtering is required to be that which causes the deposited film to be essentially free of either tensile or compressive stresses. At low pressures, the stress in a sputter deposited film is compressive and at higher pressures the stress becomes tensile. This is disclosed in D. W. Hoffman and J. A. Thornton. Thin Solid Films, vol. 40. 1977, 355 for films deposited on, e.g., glass to maintain high reflectivity of the film coatings and to avoid cracking of the coating. The transition pressure at which the stress changes sign (critical pressure where the film coating is essentially stress free) is a function of the atomic mass of the atmosphere gas and also the metal being deposited as disclosed in J. A. Thornton, J. Tabock and D. W. Hoffman., Thin Solid Films, vol. 64, 1979, 111. The geometry of the sputtering arrangement further influences the critical pressure as disclosed by D. W. Hoffman and J. A. Thornton, J. Vac. Sci.Tech., vol. 16, 1979, 134). All three references are herein expressly incorporated by reference for their teachings.

The gas in the invention sputtering chamber can be any inert gas. Argon is one example, but others like neon or krypton can be used. When using argon gas, for depositing a stress-free film of palladium this pressure is about 5 mTorr and for copper, about 3 mTorr as described in the references cited above. Using argon as the inert atmosphere, and depositing a 60/40 Pd/Cu alloy according to the present invention method, the critical atmospheric pressure is generally about 6 mTorr to obtain a stress-free deposited film. Using different gasses during sputtering and forming different composition Pd/Cu alloys would require a different critical atmospheric pressure as explained above. Selection of the necessary critical pressure to produce the stress free film according to the present invention would be determined experimentally as would be apparent to those skilled in the art in view of the present disclosure. As discussed above, I have unexpectedly found that by forming this metal film such that it is essentially free of tensile and compressive stress, even when it is separated from the substrate it does not curl up but rather the thin film remains flat. Hence this new method for making a stand-alone membrane avoids the extra efforts necessary to flatten films made by the less desirable method described above.

Generally, the membrane by the present invention is desirably used as a diaphragm in a reformer to separate hydrogen. In this use the membrane would have a thickness of between about 1 and 10 $\mu$m, more preferably at least about 6 $\mu$m. The time to sputter a film of particular thickness onto the parting material on the substrate will vary, depending on the efficiency of the sputtering equipment used and the operating conditions. For example, to make a 60/40 Pd/Cu film using an IonTech dual beam system, and a beam current of 70 mA, the deposition rate was about 1 $\mu$m per hour.

After deposition of the thin metal film, it would be separated from the substrate on which it was deposited to yield the metal membrane. This can be done conveniently by subjecting the parting material between the substrate and the film to a solvent in which the parting material is soluble. This dissolves away the parting material and frees the flat metal membrane for use, e.g., as a diaphragm in a fuel reformer. Still other uses for this membrane would be apparent to those skilled in the art. In the case of the cellulose acetate parting material, acetone will dissolve the material releasing the thin flat film.

EXAMPLE

Two 60/40 Pd/Cu film samples 3 $\mu$m thick were produced in this example. One 60/40 Pd/Cu membrane was manufactured according to an embodiment of the present invention being sputtered at 6 mTorr of pressure with argon which provided an essentially stress-free deposited film. It was removed from the substrate by dissolving the parting material and remained flat for use as a membrane. The second 60/40 Pd/Cu sample, a comparative sample not according to the present invention, was produced under with an argon pressure of 4 mTorr. This pressure did not produce an essentially stress-free deposited film. Upon removal of the film from the substrate, it rolled up into a cylindrical shape. The film would require further processing to make it flat for use as a membrane.

I claim:

1. A method of making a thin, flat metal membrane of palladium or palladium/copper alloy useful as a diaphragm in fuel reformers for separating the hydrogen from the other gaseous products of the reforming reaction, the method comprising:

(a) providing a substrate having a flat surface, at least a portion of which is coated with a parting material capable of being dissolved in a solvent;

(b) sputtering a metal layer of the palladium or palladium/copper alloy onto the parting material under an inert gas atmosphere at a pressure such that the sputtered film formed on the substrate is essentially free of tensile and compressive stress; and (c) subjecting the parting material to the solvent to dissolve the parting material and release the flat sputtered metal film yielding a membrane of palladium or palladium/copper alloy.

2. The method according to claim 1 wherein the film has a thickness of 1–10 $\mu$m.

3. The method according to claim 1 wherein copper comprises 0 to 52 wt. % of the palladium/copper alloy.

4. The method according to claim 1 wherein the substrate is a silicon wafer.

5. The method according to claim 1 wherein the parting material is cellulose acetate.

6. The method according to claim 5 wherein the solvent is acetone.

7. The method according to claim 1 wherein the sputtering step is carried out using magnetron sputtering equipment.

8. The method according to claim 1 wherein the gas is argon.

9. The method according to claim 8 wherein the film comprises 40% copper and the pressure is about 6 mTorr pressure.

10. A method of making a thin, flat metal membrane of palladium/copper alloy useful as a diaphragm in fuel reformers for separating the hydrogen from the other gaseous products of the reforming reaction, the method comprising:

(a) providing a substrate having a flat surface, at least a portion of which is coated with a parting material capable of being dissolved in a solvent;

(b) sputtering a metal layer in a thickness of 1–10 $\mu$m of the palladium/copper alloy having up to 52 wt. % copper onto the parting material under an inert gas atmosphere at a pressure such that the sputtered film formed on the substrate is essentially free of tensile and compressive stress; and (c) subjecting the parting material to the solvent to dissolve the parting material and release the flat sputtered metal film yielding a membrane of palladium/copper alloy.

11. A membrane of palladium or palladium/copper alloy, useful as a diaphragm in fuel reformers for separating the hydrogen from the other gaseous products of the reforming reaction, made by a method which comprises the steps of:
  (a) providing a substrate having a flat surface, at least a portion of which is coated with a parting material capable of being dissolved in a solvent;
  (b) sputtering a metal layer of the palladium or palladium/copper alloy onto the parting material under an inert gas atmosphere at a pressure such that the sputtered film formed on the substrate is essentially free of tensile and compressive stress; and
  (c) subjecting the parting material to the solvent to dissolve the parting material and release the flat sputtered metal film yielding a membrane of palladium or palladium/copper alloy.

12. The membrane according to claim 11 wherein the film has a thickness of 1–10 $\mu$m.

13. The membrane according to claim 11 wherein copper comprises 0 to 52 wt. % of the palladium/copper alloy.

14. The membrane according to claim 11 wherein the substrate is a silicon wafer.

15. The membrane according to claim 11 wherein the parting material is cellulose acetate.

16. The membrane according to claim 15 wherein the solvent is acetone.

17. The membrane according to claim 11 wherein the sputtering step is carried out using magnetron sputtering equipment.

18. The membrane according to claim 11 wherein the gas is argon.

19. The membrane according to claim 18 wherein the film comprises 40% copper and the pressure is about 6 mTorr pressure.

20. A thin, flat membrane of palladium/copper alloy, useful as a diaphragm in fuel reformers for separating the hydrogen from the other gaseous products of the reforming reaction, made by a method comprising the steps of:
  (a) providing a substrate having a flat surface, at least a portion of which is coated with a parting material capable of being dissolved in a solvent;
  (b) sputtering a metal layer in a thickness of 1–10 $\mu$m of the palladium/copper alloy having up to 52 wt. % copper onto the parting material under an inert gas atmosphere at a pressure such that the sputtered film formed on the substrate is essentially free of tensile and compressive stress; and
  (c) subjecting the parting material to the solvent to dissolve the parting material and release the flat sputtered metal film yielding a membrane of palladium/copper alloy.

* * * * *